DOUGLAS J. BARNES
*INVENTOR.*

BY Alden D. Redfield
Abraham Ogman
ATTORNEYS

Oct. 5, 1965 D. J. BARNES 3,210,650
AUTOMATIC GAIN CONTROL WITH MEANS ESTABLISHING
A PREDETERMINED INITIAL UNBALANCE
IN A BRIDGE CIRCUIT
Filed Nov. 1, 1961 2 Sheets-Sheet 2

DOUGLAS J. BARNES
*INVENTOR.*

BY Alden D Redfield
Abraham Ogman
ATTORNEYS 3,210,650

AUTOMATIC GAIN CONTROL WITH MEANS ESTABLISHING A PREDETERMINED INITIAL UNBALANCE IN A BRIDGE CIRCUIT

Douglas J. Barnes, Lynn, Mass., assignor to Avco Corporation, Cincinnati, Ohio, a corporation of Delaware Filed Nov. 1, 1961, Ser. No. 149,402
7 Claims. (Cl. 323—89)

This invention relates generally to audio automatic gain control (audio AGC) systems and, in particular, to a passive system.

Prior art audio AGC systems are almost universally constructed using active circuit elements, such as vacuum tubes and transistors. A serious limitation of active audio AGC systems is their limited dynamic range; i.e., usable signal amplitudes.

It is well known that the dynamic signal characteristics of vacuum tubes and transistors become nonlinear for high signals and are limited by inherent noise in their ability to handle extremely small signals. Noise and large signal nonlinearity therefore determine the dynamic range of an audio amplifier.

Audio AGC systems using active circuit elements are similarly limited and, accordingly, cannot be used to extend the dynamic range of an audio system.

An improved arrangement would consist of placing an audio AGC system having a usable dynamic range greater than the dynamic range of an active audio amplifier before the audio amplifier. The audio AGC system would then act as a variable attenuator and reduce incoming signals which occur outside the usable dynamic range of the audio amplifier to a level within the dynamic range of the audio amplifier. Large signals would be reduced sharply and small signals reduced not at all or slightly.

It is an object of the invention to provide an audio AGC system which avoids the limitations and disadvantages of prior art audio AGC systems.

It is another object of the invention to provide an audio AGC system using passive elements.

It is yet another object of the invention to provide an audio AGC system having a usable dynamic range greater than the dynamic range of amplifiers using active circuit elements.

It is yet another object of the invention to provide a variable and controllable attenuator having a wide dynamic signal range.

It is still another object of the invention to provide an audio AGC system employing bridge means constructed from passive elements.

In accordance with the invention, an audio AGC system comprises a bridge means, preferably an inherently balanced bridge means comprising two series connected resistor arms and two series connected inductor arms. Each of the inductor arms includes a magnetic core having a signal winding and a control winding wound thereon. The signal windings are series connected in phase opposition and the control windings are series connected in phase. Input and output circuit means are provided in the bridge means.

The audio AGC system also includes first current supply means coupled to the signal windings for supplying a current to these windings for adjusting the inductances of the inductor arms to a value between their maximum and minimum values of inductance.

A second current supply means is also provided. It provides current to the control windings for differentially varying the inductance value of the inductors, for unbalancing the bridge means.

A current generating means is coupled to the output circuit means and the first current means. The current generating means responds to the output signal, developed by the bridge means, to supply a current which is a function of the output signal to the control windings which flows in opposition to the current supplied to the control windings by the second current supply means, thus, varying the total current flowing therein. The variation in control winding current differentially varies the inductance values tending to vary the signal attenuation in bridge means.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

Figure 1:
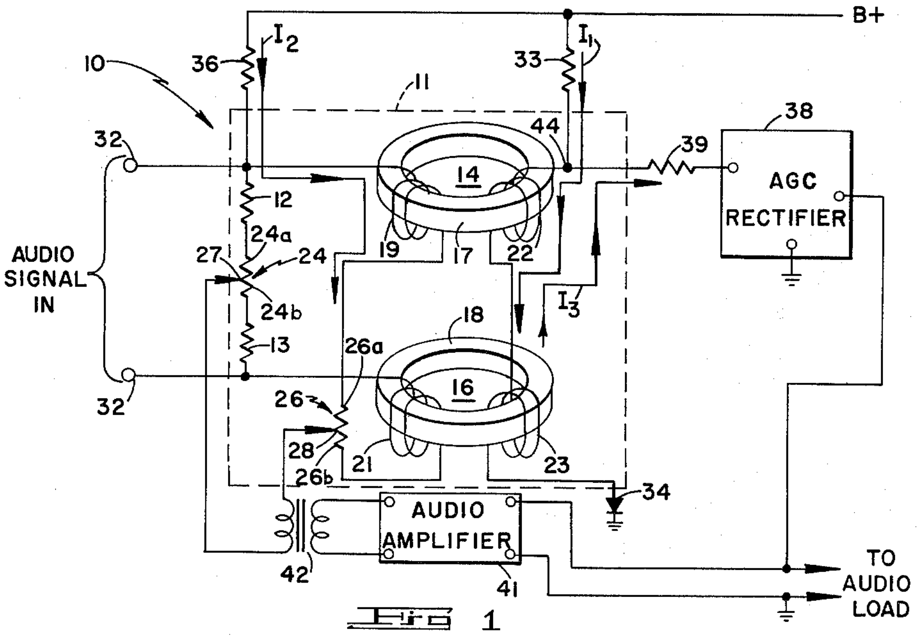
FIGURE 1 is a schematic representation of an audio AGC system embodying the principles of the present invention.

Referring to FIGURE 1 of the drawings, there is depicted an audio AGC system 10 embodying the principles of the present invention. The audio AGC system 10 comprises a bridge means 11, delineated by the dashed box, which includes two series resistors 12 and 13 and two inductors 14 and 16.

The inductors 14 and 16 comprise magnetic cores 17 and 18, respectively, on which are wound signal windings 19 and 21 and control windings 22 and 23, respectively. The signal windings 19 and 21, as shown in FIGURE 1, are connected in phase opposition. A common current flowing therein, together with current in control winding, will have an opposite effect on the inductance values of inductors 14 and 16. If the inductance increases in one inductor, it will decrease in the other. Looking at it another way, a common current, acting alone, will tend to produce flux in opposite directions in the cores 17 and 18.

The control windings 22 and 23 are series connected in phase; i.e., acting alone, a common current, in the control windings will affect the inductances and flux in inductors 14 and 16 in the same way. It will become obvious that, in the alternative, a single winding, linking cores 17 and 18, may be substituted for control windings 22 and 23.

The bridge means 11 also includes variable resistors 24 and 26 interposed between resistors 12 and 13 and signal windings 19 and 21, respectively. The variable resistors 24 and 26 include movable taps 27 and 28, respectively. The variable resistors 24 and 26 constitute a vernier adjustment for balancing the bridge means 11 in the presence of signal winding current only. Variable resistors 24 and 26 are further subdivided, schematically, into two portions **24*a*, 24*b* and 26*a*, 26*b* on opposite sides of movable taps 27 and 28**, respectively.

Bridge means 11 is the well-known Wheatstone bridge configuration having four arms. Its components are selected and adjusted to form an inherently balanced bridge. Rigorously, bridge means 11 includes two resistance arms comprising resistors 12 plus **24*a* in series and resistors 13 plus 24*b* in a series. It also includes two inductor arms, inductor 14 (signal winding 19) plus resistors 26*a* in series and inductor 16 (signal winding 21) plus resistor 26*b* in series. Since the variable resistors 24 and 26 are vernier adjustments which remain fixed once they are set, the discussion to follow will be limited to the consideration of resistors 12 and 13 as the resistor arms and inductors 14 and 16 (signal windings 19 and 21**) as the inductor arms.

Terminals 32, 32 are circuit means for supplying an alternate signal, typically an audio signal, to the bridge means 11. The movable taps 27 and 28 constitute an output circuit means from the bridge means 11. In the event the bridge means 11 is unbalanced, an output signal is developed across the movable taps 27 and 28.

Digressing briefly, it is manifest that the resistance ratio of the resistance arms, resistors 12 and 13, is equal to the impedance ratio of the inductor arms, inductors 14 and 16. Although this ratio need not be in unity, as a practical matter, a resistance and inductive impedance ratio of one is advisable and will be illustrated.

Inductors 14 and 16 are substantially identical. Their inherent parameters are the same, and they react substantially the same way to external influences.

Since resistors 12 and 13 are fixed, the audio AGC action is accomplished by varying the parameters of the inductors 14 and 16, specifically, by introducing current into the signal windings 19 and 21 and then varying the current in the control windings 22 and 23.

Thus, the audio AGC system 10 includes first current supply means coupled to the signal windings 19 and 21 for supplying current to these windings. The first current supply means comprises a series combination of a resistor 36 in series with signal windings 19 and 21 and the variable resistor 26. The series combination is coupled across B+ and ground. The current from B+ flowing through resistors 12, 13 and 24 can be neglected since it does not affect bridge parameters. An arrow $I_2$ designates the current path of the current supplied by the first current supply means to the signal windings 19 and 21.

The audio AGC system 10 also includes a second current supply means coupled to the control windings 22 and 23. The second current supply means comprises a resistor 33 connected in series with control windings 22 and 23 and a diode 34. The series combination is coupled between B+ and ground. Accordingly, current having a magnitude determined by the resistance of the series combination of the resistor 33, control windings 22 and 23 and the forward resistance of diode 34 flows through the first current supply means. This current is designated $I_1$ as indicated by an arrow so labeled. The diode 34 acts to prevent a reversal of current through the control windings 22 and 23.

Additionally, the audio AGC system includes current generating means coupled to the output circuit means, movable taps 27 and 28 and the second current supply means for supplying a current, designated $I_3$ to the control windings 22 and 23. Current $I_3$ flows in a direction opposite to current $I_1$ in the control windings 22 and 23. Thus, the total current in the control winding, hereinafter referred to as $I_c$, equals $I_1-I_3$.

The current generating means comprises a conventional AGC rectifier 38 and a resistor 39 in series therewith. Movable taps 27 and 28 are coupled through an isolating transformer 42 to the input of an audio amplifier 41 where the audio signal is amplified. The audio amplifier output is coupled to an audio load and to the input of AGC rectifier 38. The output of the AGC rectifier 38 is coupled through the resistor 39 to junction 44 of resistors 33 and 39 and control winding 22.

The audio amplifier 41 is preferably the utilization means for the audio signal applied to the input terminals 32, 32 of the bridge means 11. It is also the audio amplifier whose dynamic range is to be extended by means of the audio AGC system 10 embodied in the present invention.

The operation of the audio AGC system 10 depicted in FIGURE 1 will now be discussed. As was pointed out heretofore, the bridge means 11 is provided with circuit elements, the parameters of which form an inherently balanced bridge. That is to say the resistance ratio of the resistor arms is equal to the impedance ratio of the inductor arms, and in accordance with the previous assumption, this ratio is one. When bridge means 11 is balanced, there is no output signal available at the output circuit means, movable taps 27 and 28. To prepare audio AGC system 10 for operation, it is first necessary to adjust the inductors 14 and 16 to an inductance value between their maximum and minimum values and to unbalance the bridge means 11. Since inductive impedance is a direct function of inductance, the impedances of inductors 14 and 16 are adjusted.

Figure 2:
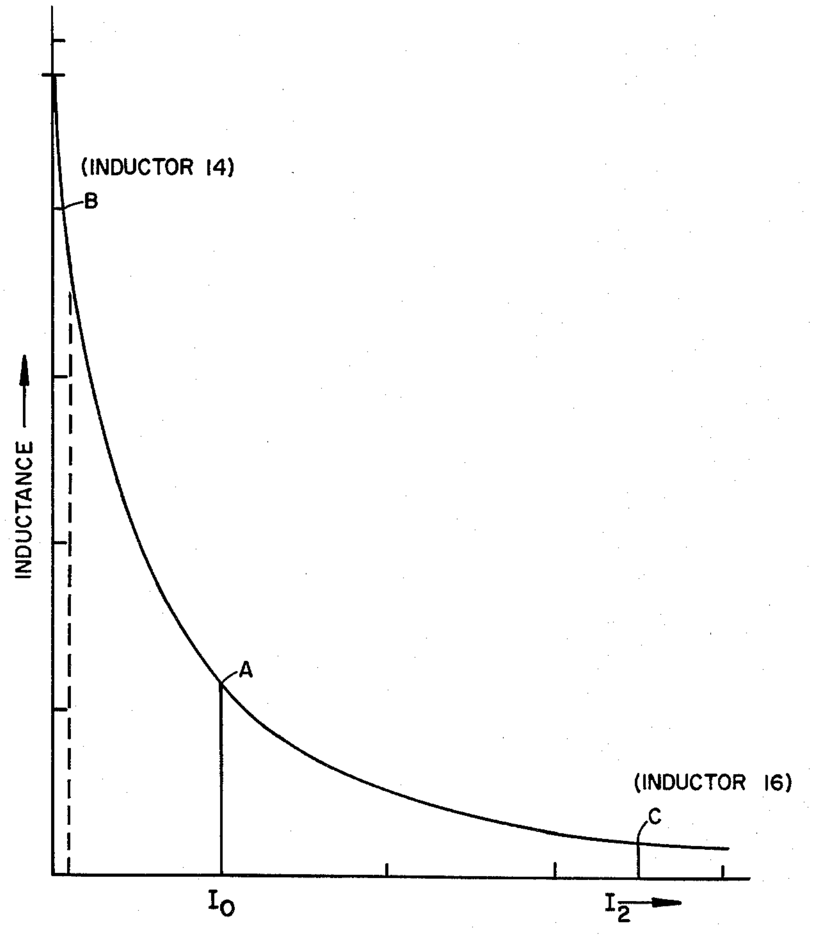
FIGURE 2 is a curve useful in explaining the operation of the FIGURE 1 audio AGC system.

Referring briefly to FIGURE 2 of the drawings, there is shown a curve of inductance or impedance versus current $I_2$. The point "A" represents the inductance value of each of the inductors 14 and 16 when a current $I_0$ flows in the signal windings 19 and 21, and when $I_1$ and $I_3$ are equal to zero. The current $I_0$ is easily obtained by adjusting the value of resistor 36 in the first current supply means.

It is quite obvious that because of the magnetic coupling between the signal windings 19 and 21 and the control windings 22 and 23, a current flowing in the control windings 22 and 23 can be made to affect the inductance value of the inductors 14 and 16 as though a change of current occurred in the signal windings 19 and 21. Thus, by changing the current in the control windings 22 and 23, it can be made to appear as though the current $I_2$ in the signal windings 19 and 21 had been varied.

More specifically, the current in the control windings 22 and 23, when changed will differentially vary the value of the inductors 14 and 16 such that as the inductance of one inductor, 16 for example, decreases toward point "C," in FIGURE 2, and the value of inductor 14 will increase toward point "B," in FIGURE 2. The differential variation occurs because signal windings 19 and 21 are connected in phase opposition whereas the control windings 22 and 23 are connected in phase.

Reviewing briefly, the inductances of inductors 14 and 16 are initially adjusted to the value indicated by point "A" in FIGURE 2 by adjusting $I_2$ in the absence of currents $I_1$ and $I_3$. A current $I_1$ is then supplied to the control windings 22 and 23 to differentially vary the inductances of the inductors 14 and 16 so that they are adjusted to the points "C" and "B," respectively, as indicated in FIGURE 2. Since the inductances of inductors 14 and 16 are now substantially different, the bridge means 11 is unbalanced. Accordingly, an audio signal applied to the input terminals 32, 32 appears at the output circuit means, movable taps 27 and 28 of the bridge means 11. There is incurred at least a 6 db loss in signal strength through the bridge means 11 since the ratio of the resistance arms is unity. In practice, the minimum attenuation is closer to 10 db due to stray capacity effects and other spurious conditions.

An audio signal appearing at the output circuit means, movable taps 27 and 28, is fed through transformer 42 to audio amplifier 41 where the signal is amplified and utilized. A portion of the amplifier 41 output signal is coupled to AGC rectifier 38 where it is converted to a negative uni-directional (D.C.) signal in a conventional rectifier circuit. Since the bridge means 11 is affected by current changes, the signal generated by the AGC rectifier 38 will be considered to be a current signal. The current generated by AGC rectifier 38 is coupled to control windings 22 and 23 through the resistor 39. This current is identified in FIGURE 1 by the arrow $I_3$.

It is seen that the currents $I_1$ and $I_3$ flow in opposite directions through the control windings 22 and 23. $I_3$ increases as the signal received from the bridge means 11 through audio amplifier 41 increases and drops as the signal amplitude drops. As current $I_3$ increases, it tends to reduce the current flowing in the control windings 22 and 23 to zero. Diode 34 prevents a current reversal in the control windings 22 and 23 should $I_3$ become larger than $I_1$.

As $I_1-I_3$, or $I_c$ tends toward zero, the inductance values of inductors 14 and 16 are again differentially varied, but in a direction opposed to the differential variation that cause the bridge to be unbalanced. In other words, the inductances of inductors 14 and 16 tend to move from points "C" and "B," respectively, toward point "A." See FIGURE 2. As point "A" is approached, the bridge tends toward a balanced condition, and it attenuates the audio signal being translated thereby to a greater extent. In the extreme case, when the bridge means 11 is balanced, the bridge means 11 becomes an infinite attenuator with the result that there is no output signal therefrom.

An equilibrium condition is reached for specific amplitudes of incoming signal. As the amplitude of this signal varies, $I_c$ will vary to adjust the transfer characteristic, attenuation, of bridge means 11.

This invention has been reduced to practice and found to operate in a highly satisfactory manner. An illustrative set of bridge means 11 parameters are:

| | |
|---|---|
| Resistances **12** and **13** | 220 ohms. |
| Resistances **24** and **26** | 100 ohms. |
| Magnetic cores | Part No. P4153–B2 G. L. Electronics Co. |
| Signal windings **19** and **22** | 600 turns. |
| Control windings **22** and **23** | 200 turns. |

Figure 3:
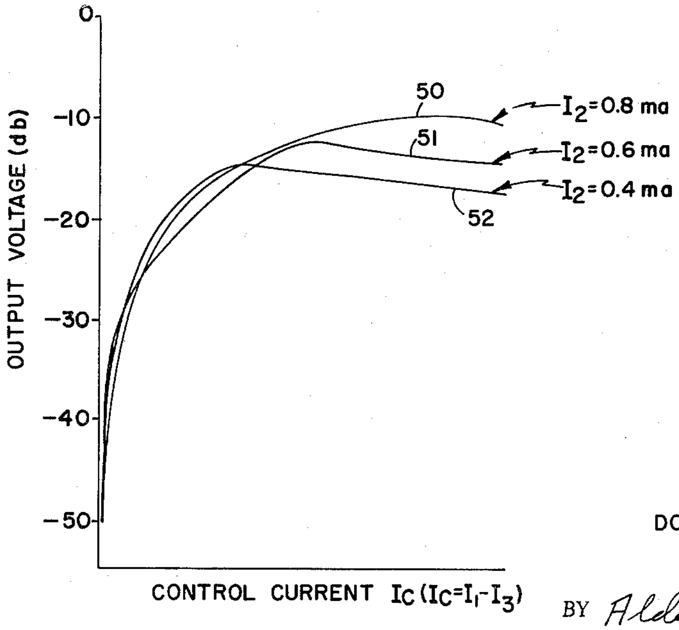
FIGURE 3 is a series of curves useful in describing the operation of the FIGURE 1 audio AGC system.

A dynamic signal range of 50 db is depicted in FIGURE 3. This particular circuit was used in conjunction with an audio amplifier having a dynamic range of 30 db and accordingly, extended the range of the audio amplifier by 20 db. Illustrative curves 50, 51 and 52 in FIGURE 3 also show bridge output vs. $I_c$ for three values of $I_2$.

Summarizing briefly, it will be noted that the audio AGC system 10 is a completely passive system containing no active elements such as transistors or tubes. The diode 34, shown in FIGURE 1, is supplied for convenience; it is not essential for the operation of the audio AGC system 10. The absence of transistors, in particular, also makes the audio AGC system 10 relatively insensitive to temperature variations.

It follows from the preceding discussion that the bridge means 11 could also be used as a variable attenuation for audio signals. In its simplest form, as a signal attenuator, $I_3$ current generating means would not be used. To attenuate a signal being translated through the bridge means 11, a specific amount, it would be merely necessary to manually or automatically adjust the value of $I_1$ up or down depending on whether a small amount of attenuation or a large amount of attenuation is desired.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

I claim:

1. An audio AGC system comprising:

(a) balanced bridge means including output circuit means, two series connected resistor arms and two series connected inductor arms, each of the inductor arms having a magnetic core with a signal winding and a control winding thereon, the signal windings being coupled in phase opposition, the control windings being coupled in phase;

(b) circuit means for supplying an audio signal to said bridge means;

(c) first means coupled to the signal windings for supplying current to the signal windings for adjusting the inductances to predetermined values;

(d) second means coupled to the control windings for differentially adjusting the inductances of the inductors for unbalancing said bridge means thereby developing an output signal at the output circuit means; and (e) signal generating means responsive to the output signal for supplying a second current to the control windings tending to rebalance said bridge means as a function of the output signal.

2. An audio AGC system comprising:

(a) balanced bridge means including output circuit means, two series connected resistor arms and two series connected inductor arms, each of the inductor arms having a magnetic core with a signal winding and a control winding thereon, the signal windings being coupled in phase opposition, the control windings being coupled in phase;

(b) circuit means for supplying an audio signal to said bridge means;

(c) first current supply means coupled to the signal windings for supplying current to the signal windings for adjusting the inductances to predetermined values;

(d) second current supply means for supplying a first current to the control windings for differentially adjusting the inductances of the inductors for unbalancing said bridge means thereby developing an output signal at the output circuit means; and (e) current generating means for supplying a second current, the magnitude of which is a function of the output signal, to the control windings, the second current flowing in opposition to the current supplied to the control windings by the second current supply means.

3. An audio AGC system comprising:

(a) bridge means including output circuit means, two series connected resistor arms and two series connected inductor arms, each of the inductor arms having a magnetic core with a signal winding and a control winding thereon, the signal windings being coupled in phase opposition, the control windings being coupled in phase;

(b) circuit means for supplying an audio signal to said bridge means;

(c) first current supply means coupled to the signal windings for supplying current to the signal windings for adjusting the inductances to predetermined value and for balancing said bridge means;

(d) second current supply means for supplying a first current to the control windings for differentially adjusting the inductances of the inductors for unbalancing said bridge means thereby developing an output signal at the output circuit means;

(e) utilization means for using the output signal; and (f) current generating means coupled to the utilization means and the control windings for supplying a second current flowing in opposition to the current supplied therein by the second current supply means to said control windings.

4. An audio AGC system comprising:

(a) balanced bridge means having two resistor arms and two reactor arms;

(b) means for biasing the reactors to a predetermined value of reactance between their maximum and minimum values;

(c) means for differentially varying the reactance values of said reactors to an initially predetermined extent for unbalancing said bridge means; and (d) means coupled to the bridge means responsive to a signal therefrom for differentially varying the values of reactance as a function of the signal from the bridge means.

5. An audio AGC system comprising:

(a) balanced bridge means having two fixed impedance arms and two variable impedance arms;

(b) means for adjusting the variable impedance arms to a value between their maximum and minimum values;

(c) means for differentially varying the variable impedance values to an initially predetermined extent for unbalancing said bridge means; and (d) means coupled to said bridge means responsive to a signal therefrom for differentially varying the values of impedance of said variable impedance means as a function of the signal received from the bridge means.

6. An audio AGC system comprising:

(a) balanced bridge means including output circuit means, two series connected fixed impedance arms and two series connected variable inductor arms, said variable impedances comprising magnetic cores with a signal winding and control winding thereon, the signal windings being coupled in phase opposition, the control windings being coupled in phase;

(b) an electrical power source coupled through a first resistor to the signal windings for supplying current to the signal windings for adjusting the impedances of the inductor arms to predetermined values and through a second resistor to the control windings for supplying a current to the control windings for differentially adjusting the inductances of the inductors for unbalancing said bridge means; and (c) signal generating means coupled between said output circuit means and the control windings for generating a current, the magnitude of which is proportional to the signal received from said output circuit means for supplying said current to the control windings in a direction opposite to the first current flowing therein.

7. A signal attenuator comprising:

(a) balanced bridge means including two series connected resistor arms and two series connected inductor arms, each of the inductor arms having a magnetic core with a signal winding and a control winding thereon, the signal windings being coupled in phase opposition, the control windings being coupled in phase;

(b) first means coupled to the signal windings for supplying current to the signal windings for adjusting the inductances of the inductors to a predetermined value; and (c) second means for supplying a current to the control windings for differentially varying the values of inductance of the inductors to a predetermined extent for unbalancing said bridge means to a predetermined extent thereby reducing the signal attenuation characteristics thereof to a predetermined extent.

References Cited by the Examiner

UNITED STATES PATENTS

| | | | |
|---|---|---|---|
| 2,482,064 | 9/49 | Hornfeck | 323—75 |
| 2,494,876 | 1/50 | Hornfeck | 323—89 |
| 2,688,724 | 9/54 | Newell | 323—89 |
| 2,904,744 | 9/59 | Lalio | 323—89 |

LLOYD McCOLLUM, *Primary Examiner.*